(12) United States Patent
Choi et al.

(10) Patent No.: US 11,476,220 B2
(45) Date of Patent: Oct. 18, 2022

(54) SEMICONDUCTOR PACKAGES

(71) Applicant: Samsung Electronics Co., Ltd., Suwon-si (KR)

(72) Inventors: Jimin Choi, Seoul (KR); Jung-Hoon Han, Hwaseong-si (KR); Yeonjin Lee, Suwon-si (KR); Jong-Min Lee, Hwaseong-si (KR); Jihoon Chang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 94 days.

(21) Appl. No.: 17/146,550

(22) Filed: Jan. 12, 2021

(65) Prior Publication Data

US 2021/0305190 A1 Sep. 30, 2021

(30) Foreign Application Priority Data

Mar. 27, 2020 (KR) ........................ 10-2020-0037642
Jul. 1, 2020 (KR) ........................ 10-2020-0081030

(51) Int. Cl.
*H01L 25/065* (2006.01)
*H01L 23/00* (2006.01)
(Continued)

(52) U.S. Cl.
CPC .............. *H01L 24/14* (2013.01); *H01L 22/34* (2013.01); *H01L 23/562* (2013.01);
(Continued)

(58) Field of Classification Search
CPC ....... H01L 24/14; H01L 22/34; H01L 23/562; H01L 25/0657; H01L 25/18; H01L 2224/14517; H01L 2225/06513; H01L 2225/06541; H01L 2225/06555; H01L 2225/06596; H01L 2924/1431; H01L 2924/1434; H01L 24/06; H01L 24/05;
(Continued)

(56) References Cited

U.S. PATENT DOCUMENTS 6,798,073 B2 9/2004 Lin et al.
7,026,234 B2 4/2006 Jao et al.
(Continued)

FOREIGN PATENT DOCUMENTS

JP 2008-294127 A 12/2008
KR 10-0943284 B1 2/2010

*Primary Examiner* — Elias Ullah
(74) *Attorney, Agent, or Firm* — Myers Bigel, P.A.

(57) ABSTRACT

Semiconductor packages may include a semiconductor chip on a substrate and an under-fill layer between the semiconductor chip and the substrate. The semiconductor chip may include a semiconductor substrate including first and second regions, and an interlayer dielectric layer that may cover the semiconductor substrate and may include connection lines. First conductive pads may be on the first region and may be electrically connected to some of the connection lines. Second conductive pads may be on the second region and may be electrically isolated from all of the connection lines. The semiconductor chip may also include a passivation layer that may cover the interlayer dielectric layer and may include holes that may expose the first and second conductive pads, respectively. On the second region, the under-fill layer may include a portion that may be in one of the first holes and contact one of the second conductive pads.

20 Claims, 13 Drawing Sheets

(51) Int. Cl.
*H01L 25/18* (2006.01)
*H01L 21/66* (2006.01)

(52) U.S. Cl.
CPC .......... *H01L 25/0657* (2013.01); *H01L 25/18* (2013.01); *H01L 2224/14517* (2013.01); *H01L 2225/06513* (2013.01); *H01L 2225/06541* (2013.01); *H01L 2225/06555* (2013.01); *H01L 2225/06596* (2013.01); *H01L 2924/1431* (2013.01); *H01L 2924/1434* (2013.01)

(58) Field of Classification Search
CPC ......... H01L 2224/06515; H01L 21/563; H01L 23/3128; H01L 24/13; H01L 24/16; H01L 24/32; H01L 24/73; H01L 24/83; H01L 24/92; H01L 2224/1412; H01L 2224/14133; H01L 2224/83862; H01L 24/17; H01L 2224/13025; H01L 2224/16145; H01L 2224/16225; H01L 2224/1712; H01L 2224/17133; H01L 2224/17515; H01L 2224/32145; H01L 2224/32225; H01L 2224/73204; H01L 2224/92125; H01L 2924/15174; H01L 2924/15311; H01L 2924/181

See application file for complete search history.

(56) References Cited

U.S. PATENT DOCUMENTS

| | | | |
|---|---|---|---|
| 7,728,442 | B2 | 6/2010 | Yoshioka et al. |
| 8,841,783 | B2 | 9/2014 | Wakiyama |
| 9,691,686 | B2 | 6/2017 | Huang et al. |
| 9,865,579 | B2 | 1/2018 | Nagami |
| 9,893,028 | B2 | 2/2018 | Yu et al. |
| 10,510,654 | B2 | 12/2019 | Hsieh et al. |

SEMICONDUCTOR PACKAGES

CROSS-REFERENCE TO RELATED APPLICATIONS

This U.S. nonprovisional application claims priority under 35 U.S.C § 119 to Korean Patent Application Nos. 10-2020-0037642 filed on Mar. 27, 2020 and 10-2020-0081030 filed on Jul. 1, 2020 in the Korean Intellectual Property Office, the disclosures of which are hereby incorporated by reference in their entireties.

BACKGROUND

The present inventive concepts relate to a semiconductor package.

A semiconductor package is provided to implement an integrated circuit chip to qualify for use in electronic products. A semiconductor package is typically configured such that a semiconductor chip is mounted on a printed circuit board (PCB) and bonding wires or bumps are used to electrically connect the semiconductor chip to the printed circuit board. With the development of the electronics industry, many studies have been conducted to improve reliability and durability of semiconductor packages.

SUMMARY

Some example embodiments of the present inventive concepts provide a semiconductor package with improved reliability and improved and/or optimized performance.

An object of the present inventive concepts is not limited to the mentioned above, and other objects which have not been mentioned above will be clearly understood to those skilled in the art from the following description.

According to some example embodiments of the present inventive concepts, semiconductor packages may comprise: a semiconductor chip on a package substrate; and an under-fill layer between the semiconductor chip and the package substrate. The semiconductor chip may include: a semiconductor substrate; an interlayer dielectric layer on the semiconductor substrate and including a plurality of connection lines; a plurality of conductive pads on the interlayer dielectric layer, first ones of the plurality of conductive pads being electrically connected to first ones of the plurality of connection lines, respectively, and second ones of plurality of conductive pads being electrically isolated from the plurality of connection lines; a passivation layer on the interlayer dielectric layer and including a plurality of first holes, the plurality of first holes on the first ones of the plurality of conductive pads and the second ones of the plurality of conductive pads, respectively; and a plurality of first conductive bumps bonded to the first ones of the plurality of conductive pads, respectively. The under-fill layer may include a first portion, and the first portion may be in a first one of the plurality of first holes and may be in contact with a first conductive pad of the second ones of the plurality of conductive pads.

According to some example embodiments of the present inventive concepts, semiconductor packages may comprise: a semiconductor chip on a package substrate. The semiconductor chip may include: a semiconductor substrate; an interlayer dielectric layer on the semiconductor substrate and including a plurality of connection lines; a plurality of conductive pads on the interlayer dielectric layer, first ones of the plurality of conductive pads being electrically connected to first ones of the plurality of connection lines, and; second ones of the plurality of conductive pads being electrically isolated from the plurality of connection lines; and a passivation layer on the interlayer dielectric layer. The passivation layer may include a plurality of first holes and a second hole. Ones of plurality of first holes may be on the first ones of the plurality of conductive pads and the second ones of the plurality of conductive pads respectively. The second hole may not vertically overlap any of the first ones of the plurality of conductive pads and does not vertically overlap any of the second ones of the plurality of conductive pads.

According to some example embodiments of the present inventive concepts, semiconductor packages may comprise: first, second, and third semiconductor chips that are sequentially stacked; a plurality of first electric conductive bumps and a plurality of first dummy conductive bumps between the first semiconductor chip and the second semiconductor chip; and a plurality of second electric conductive bumps and a plurality of second dummy conductive bumps between the second semiconductor chip and the third semiconductor chip. The plurality of first electric conductive bumps and the plurality of second electric conductive bumps may transmit electrical signals between the first, second, and third semiconductor chips. The plurality of first dummy conductive bumps and the plurality of second dummy conductive bumps may be electrically floated. The number of the first electric conductive bumps may be equal to the number of the second electric conductive bumps. The number of the first dummy conductive bumps may be different from the number of the second dummy conductive bumps.

DETAILED DESCRIPTION

Some example embodiments of the present inventive concepts will now be described in detail with reference to the accompanying drawings to aid in clearly explaining the present inventive concepts.

Figure 1:
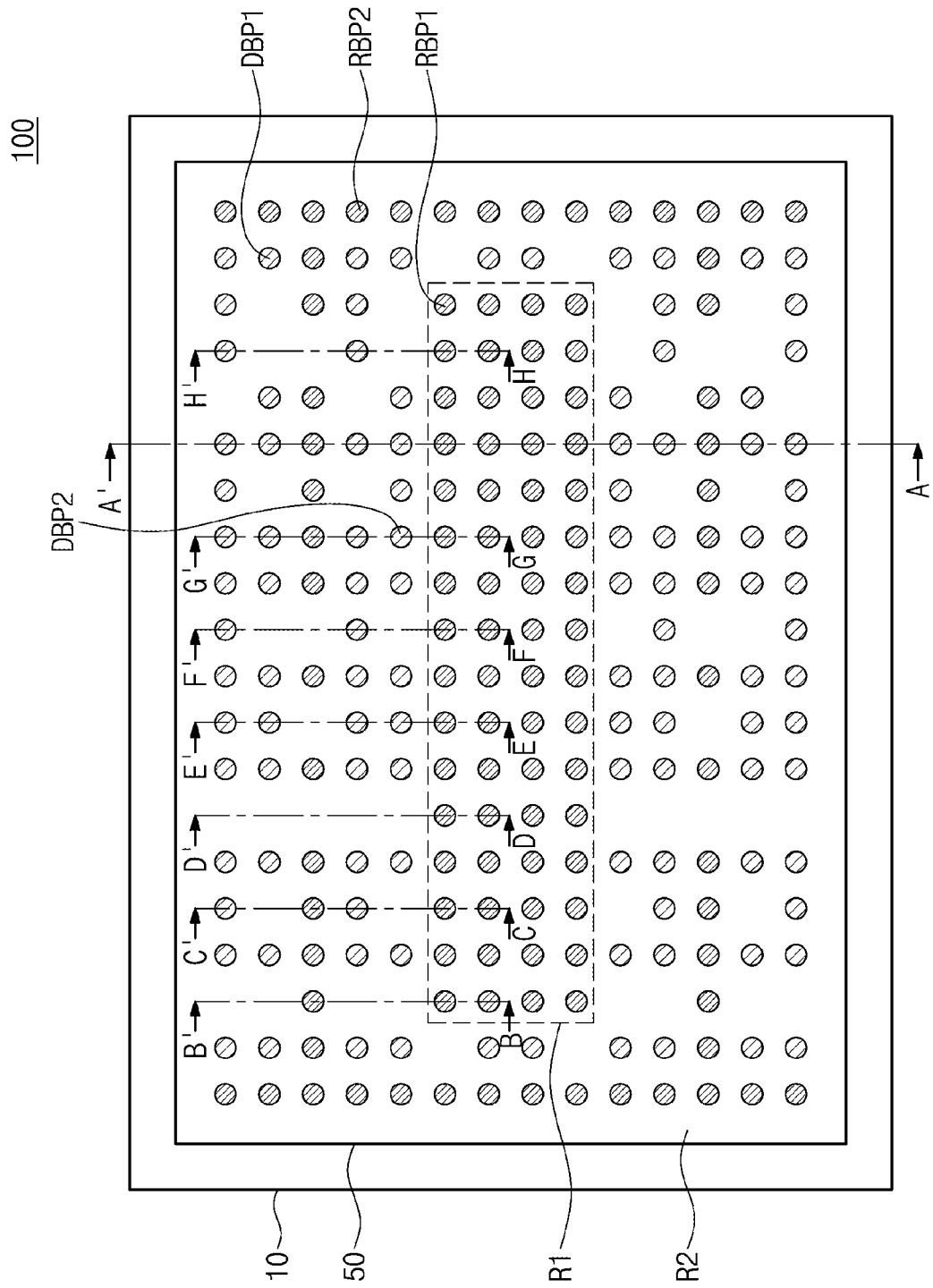
FIG. 1 illustrates a plan view showing a semiconductor package according to some example embodiments of the present inventive concepts.
Figure 2:
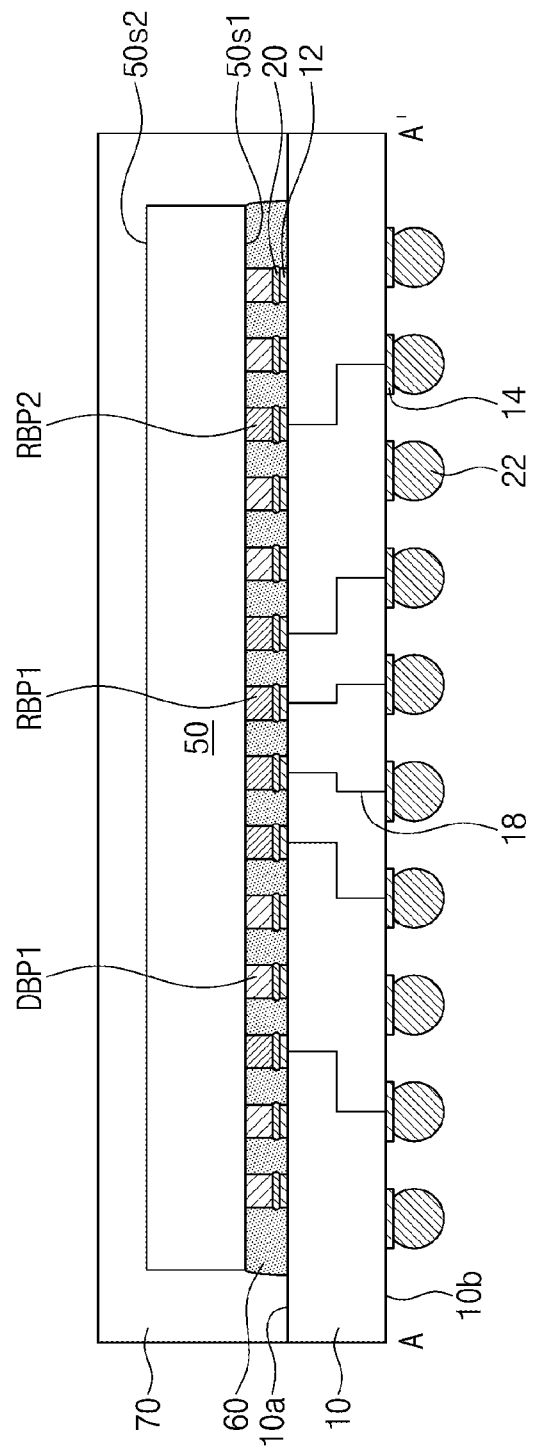
FIG. 2 illustrates a cross-sectional view taken along line A-A' of FIG. 1 according to some example embodiments of the present inventive concepts.

FIG. 1 illustrates a plan view showing a semiconductor package according to some example embodiments of the present inventive concepts. FIG. 2 illustrates a cross-sectional view taken along line A-A' of FIG. 1 according to some example embodiments of the present inventive concepts.

Referring to FIGS. 1 and 2, a semiconductor package 100 according to some example embodiments may include a semiconductor chip 50 mounted on a package substrate 10. A single semiconductor chip 50 is illustrated by way of example, but a plurality of semiconductor chips 50 may be stacked on one another or may be arranged side by side. The package substrate 10 may be, for example, a single-layered or multi-layered printed circuit board. In some embodiments, the package substrate 10 may be an interposer substrate formed of silicon. In some embodiments, the package substrate 10 may be a separate semiconductor chip. The package substrate 10 may have a first substrate surface 10a and a second substrate surface 10b that are opposite to each other. The semiconductor chip 50 may be mounted on the first substrate surface 10a. The semiconductor chip 50 and the package substrate 10 may be covered with a mold layer 70. The mold layer 70 may include, for example, a dielectric resin, such as an epoxy molding compound (EMC). The mold layer 70 may further include fillers, which fillers may be dispersed in the dielectric resin. The fillers may include, for example, silicon oxide (SiO$_2$).

The first substrate surface 10a may be provided thereon with first substrate pads 12. The second substrate surface 10b may be provided thereon with second substrate pads 14. The package substrate 10 may be provided therein with substrate internal lines 18 that connect ones of the first substrate pads 12 to the second substrate pads 14. The substrate internal lines 18 may include vias. The first substrate pads 12, the second substrate pads 14, and the substrate internal lines 18 may include metal, such as copper or aluminum. Solder balls 22 may be bonded to the second substrate pads 14. The solder balls 22 may include, for example, tin, lead, and/or silver. As used herein the term "and/or" includes any and all combinations of one or more of the associated listed items.

The semiconductor chip 50 may be one selected from system LSI (large scale integration) chips, logic circuit chips, image sensor chips such as a CMOS image sensor (CIS), flash memory chips, DRAM chips, SRAM chips, EEPROM chips, PRAM chips, MRAM chips, and ReRAM chips.

The semiconductor chip 50 may have a first chip surface 50s1 and a second chip surface 50s2 that are opposite to each other. The first chip surface 50s1 may be adjacent to the first substrate surface 10a and/or may face the first substrate surface 10a. The semiconductor chip 50 may include a first region R1 and a second region R2. The first region R1 may be a central section. The second region R2 may be an edge section that surrounds the first region R1. The first region R1 may be an area on which are disposed terminals for transfer of electrical signals. The second region R2 may be an area on which are disposed dummy terminals irrelevant to transfer of electrical signals. The dummy terminals may not transmit electrical signals during operation of the semiconductor chip 50. The first and second regions R1 and R2 may be variously arranged. For example, the second region R2 may be disposed on a center, and the first region R1 may enclose (e.g., partially enclose or completely enclose) the second region R2. In some embodiments, one or both of the first and second regions R1 and R2 may be provided in plural. Conductive bumps RBP1, RBP2, DBP1, and DBP2 may be bonded to the first chip surface 50s1. The conductive bumps RBP1, RBP2, DBP1, and DBP2 may include a single-layered or multi-layered structure including copper and/or nickel.

The conductive bumps RBP1, RBP2, DBP1, and DBP2 may include first electric conductive bumps RBP1, second electric conductive bumps RBP2, first dummy conductive bumps DBP1, and second dummy conductive bumps DBP2. The first and second electric conductive bumps RBP1 and RBP2 may be actually in use for input and output of electrical signals (e.g., data signals, power signals, and ground signals). The first and second dummy conductive bumps DBP1 and DBP2 may be electrically floated and/or may not be supplied with electrical signals. In some embodiments, the first and second dummy conductive bumps DBP1 and DBP2 may not be electrically connected to any conductive elements (e.g., a plurality of stacked chip internal lines 53 and a plurality of top wiring lines 55 in FIG. 3) such that electric current may not flow through the first and second dummy conductive bumps DBP1 and DBP2. The first electric conductive bumps RBP1 may be disposed on the first region R1. The second electric conductive bumps RBP2 and the first and second dummy conductive bumps DBP1 and DBP2 may be disposed on the second region R2.

Figure 3:
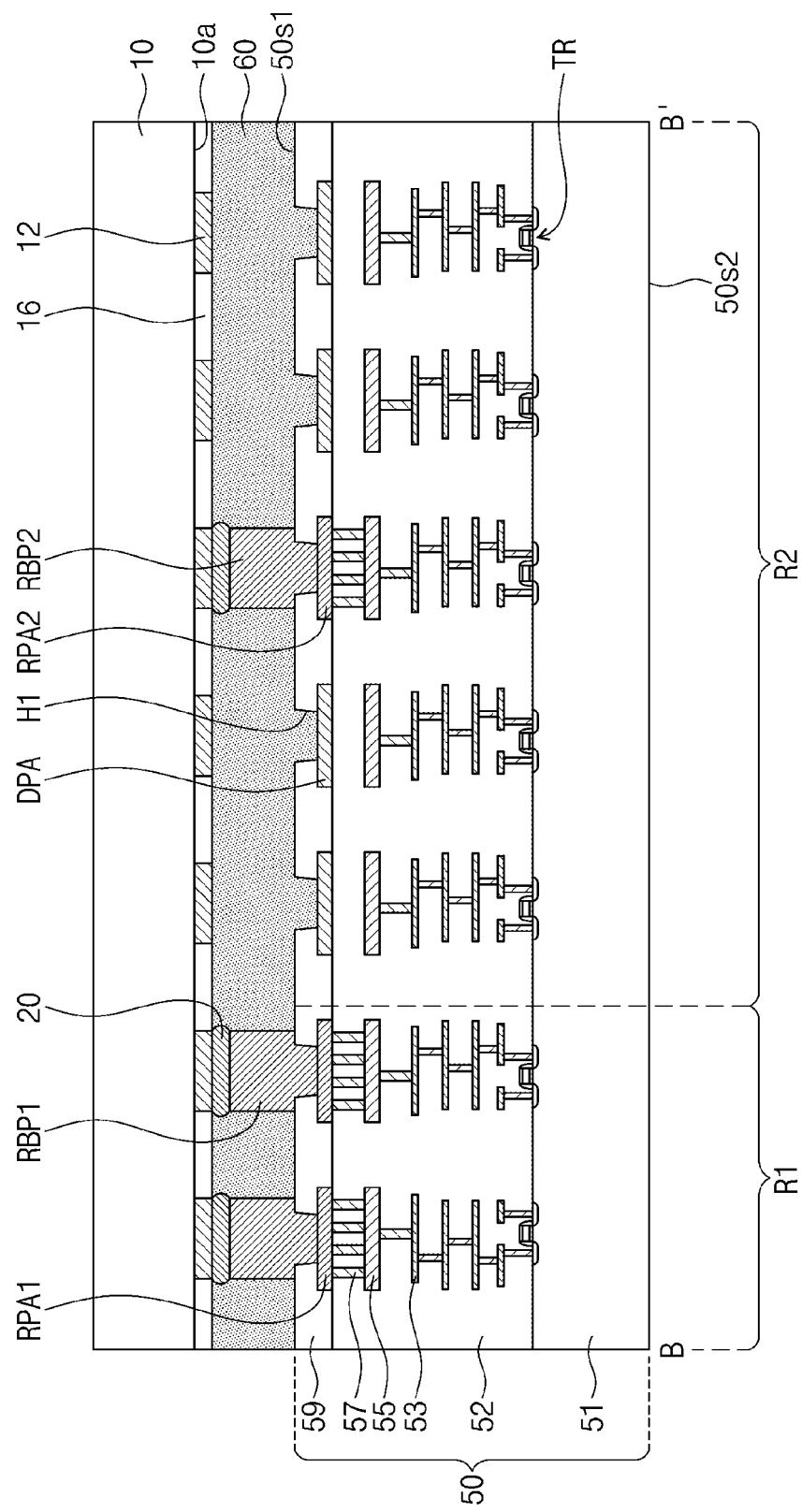
FIG. 3 illustrates a cross-sectional view taken along line B-B' of FIG. 1 according to some example embodiments of the present inventive concepts.

FIG. 3 illustrates a cross-sectional view taken along line B-B' of FIG. 1 according to some example embodiments of the present inventive concepts.

Referring to FIG. 3, the semiconductor chip 50 may include a semiconductor substrate 51. The semiconductor substrate 51 may be, for example, a single-crystalline silicon substrate. A plurality of transistors TR may be disposed on the semiconductor substrate 51. The transistors TR may be covered with an interlayer dielectric layer 52. The interlayer dielectric layer 52 may have a single-layered or multi-layered structure including a silicon oxide layer, a silicon nitride layer, a silicon oxynitride layer, and/or a porous dielectric layer. The interlayer dielectric layer 52 may have therein a plurality of stacked chip internal lines 53, a plurality of top wiring lines 55, and a plurality of internal vias 57. The chip internal lines 53 may be electrically connected to the transistors TR. The transistors TR and the chip internal lines 53 may constitute internal integrated circuits. The top wiring line 55 may be one of the chip internal lines 53, and may correspond to one of the chip internal lines 53 that is present at uppermost position. The chip internal lines 53 may include, for example, copper and/or tungsten. The top wiring lines 55 may include, for example, aluminum. The chip internal lines 53 may have their thicknesses less than those of the top wiring lines 55.

Conductive pads RPA1, RPA2, and DPA may be disposed on the interlayer dielectric layer 52. The conductive pads RPA1, RPA2, and DPA may include, for example, aluminum. The conductive pads RPA1, RPA2, and DPA may include first electric conductive pads RPA1, second electric conductive pads RPA2, and dummy conductive pads DPA. The first electric conductive pads RPA1 may be disposed on the first region R1. The second electric conductive pads RPA2 and the dummy conductive pads DPA may be disposed on the second region R2.

The first electric conductive pads RPA1 and the second electric conductive pads RPA2 may be connected (e.g., electrically connected) through the internal vias 57 to the top wiring lines 55. The dummy conductive pads DPA may be electrically insulated (or floated) without being connected to the top wiring lines 55. The interlayer dielectric layer 52 may be covered with a passivation layer 59. In some embodiments, the dummy conductive pads DPA may not be electrically connected to any conductive elements (e.g., a plurality of stacked chip internal lines 53 and a plurality of top wiring lines 55 in FIG. 3) such that electric current may not flow through the dummy conductive pads DPA. The passivation layer 59 may have, for example, a bi-layered structure including a silicon oxide layer and a silicon nitride layer. In some embodiments, the passivation layer 59 may further include photosensitive polyimide (PSPI) on the silicon nitride layer. The passivation layer 59 may include first holes H1 that expose the conductive pads RPA1, RP2, and DPA. The passivation layer 59 may have a top surface that corresponds to the first chip surface 50s1 of the semiconductor chip 50. The semiconductor substrate 51 may have a bottom surface that corresponds to the second chip surface 50s2 of the semiconductor chip 50.

The first electric conductive bumps RBP1 may be correspondingly bonded to the first electric conductive pads RPA1. In some example embodiments, the second electric conductive bump RBP2 may be bonded to the second electric conductive pad RPA2. FIG. 3 depicts a single second electric conductive bump RBP2, but as shown in FIG. 1, the semiconductor package 100 may include a plurality of second electric conductive bumps RBP2 and a plurality of second electric conductive pads RPA2 that correspond to the plurality of second electric conductive bumps RBP2. The second electric conductive bumps RBP2 may be correspondingly bonded to the second electric conductive pads RPA2. The first and second electric conductive bumps RBP1 and RBP2 may be correspondingly bonded through solder layers 20 to the first substrate pads 12. The solder layers 20 may include tin, lead, and/or silver. In some embodiments, each of the first and second electric conductive bumps RBP1 and RBP2 may contact a respective one of the solder layers 20 that contact the first substrate pads 12, respectively, as illustrated in FIG. 3, and thus each of the first and second electric conductive bumps RBP1 and RBP2 may be electrically connected to a respective one of the first substrate pads 12 through an intervening solder layer 20.

Although not shown in FIG. 3, a metal base layer (e.g., a metal base layer 71 in FIG. 9) may be interposed between the first electric conductive pad RPA1 and the first electric conductive bump RBP1 and between the second electric conductive pad RPA2 and the second electric conductive bump RBP2. The metal base layer may include, for example, a diffusion stop layer and/or a seed layer. The diffusion stop layer may include, for example, a titanium layer and/or a titanium nitride layer. The seed layer may include, for example, a copper layer.

Although not shown in FIG. 3, a diffusion stop layer and/or an adhesive layer (e.g., a diffusion stop layer 62 and an adhesive layer 64 in FIG. 9) may be interposed between the solder layer 20 and each of the first and second electric conductive bumps RBP1 and RBP2. The diffusion stop layer 62 may include, for example, nickel, and may serve to prevent diffusion of copper. The adhesive layer may include, for example, copper and/or gold, and may serve to increase an adhesive force between the diffusion stop layer and the solder layer 20.

The first and second substrate surfaces 10a and 10b of the package substrate 10 may be covered with a substrate passivation layer 16. The substrate passivation layer 16 may be, for example, a photosensitive solder resist (PSR) layer. An under-fill layer 60 may fill a gap between the package substrate 10 and the semiconductor chip 50. The under-fill layer 60 may include, for example, a thermo-curable resin and/or a photo-curable resin. The under-fill layer 60 may be formed of, for example, a non-conductive film (NCF). It will be understood that "an element A covers an element B" (or similar language) may mean that the element A is on the element B but does not necessarily mean that the element A covers the element B entirely.

As shown in FIG. 3, neither the first dummy conductive bump DBP1 nor the second dummy conductive bump DBP2 of FIG. 1 may be disposed on the dummy conductive pad DPA. The dummy conductive pads DPA may have their top surfaces exposed to the first holes H1. The under-fill layer 60 may be in contact through the first holes H1 with the top surfaces of the dummy conductive pads DPA. The under-fill layer 60 may fill the first holes H1 on the dummy conductive pads DPA.

Figure 4:
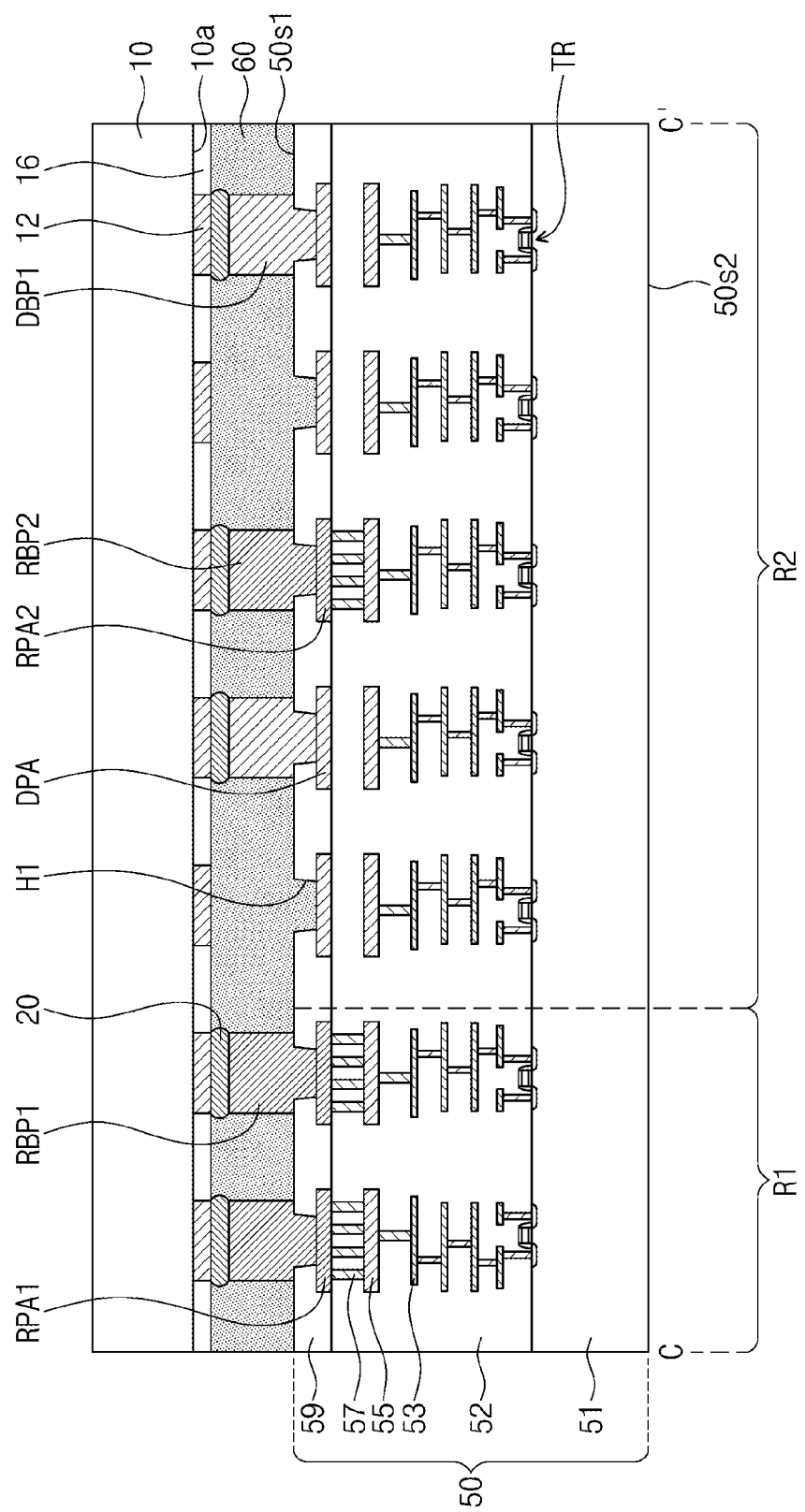
FIG. 4 illustrates a cross-sectional view taken along line C-C' of FIG. 1 according to some example embodiments of the present inventive concepts.

FIG. 4 illustrates a cross-sectional view taken along line C-C' of FIG. 1 according to some example embodiments of the present inventive concepts.

Referring to FIG. 4, the first dummy conductive bumps DBP1 may be bonded to first ones of the dummy conductive pads DPA. The first dummy conductive bumps DBP1 may not be bonded to second ones of the dummy conductive pads DPA, and the under-fill layer 60 may be in contact with the second ones of the dummy conductive pads DPA. The first dummy conductive bumps DBP1 may not serve to transmit signals, but may support the semiconductor chip 50, may reduce and/or control warpage of the semiconductor package 100, or may adjust heat radiation properties of the semiconductor package 100. Therefore, the number and position of the first dummy conductive bumps DBP1 may be adjusted to improve or optimize reliability and performance of the semiconductor package 100. For example, when the first dummy conductive bumps DBP1 are provided in an extraordinarily large number or are extremely close to the first and second electric conductive bumps RBP1 and RBP2, there may be a high likelihood of occurrence of short-circuits between the conductive bumps RBP1, RBP2, DBP1, and DBP2.

Moreover, the conductive bumps RBP1, RBP2, DBP1, and DBP2 may have different thermal and physical characteristics with respect to the semiconductor chip 50 and the package substrate 10, and thus when the number of the dummy conductive bumps DBP1 and DBP2 is excessively large or small, the semiconductor package 100 may have poor characteristics of warpage or heat radiation. Accordingly, the number of the first dummy conductive bumps DBP1 may be adjusted and/or optimized if needed.

Although not shown in FIG. 4, a metal base layer (e.g., a metal base layer 71 in FIG. 9) may be interposed between the dummy conductive pad DPA and the first dummy conductive bump DBP1. In addition, a diffusion stop layer and/or an adhesive layer (e.g., a diffusion stop layer 62 and an adhesive layer 64 in FIG. 9) may be interposed between the solder layer 20 and the first dummy conductive bump DBP1. Other configurations may be identical or similar to those discussed with reference to FIG. 3.

Figure 5:
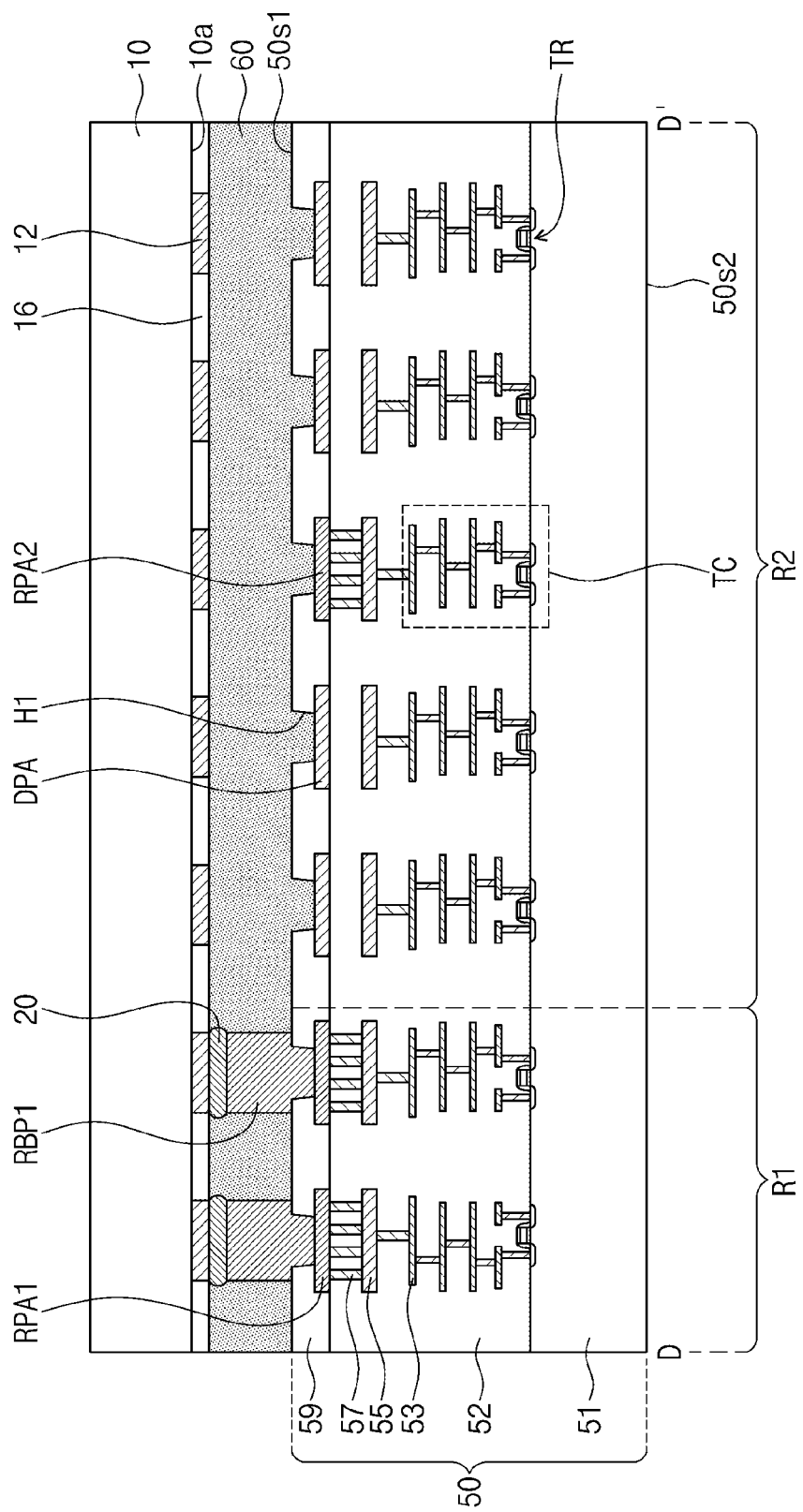
FIG. 5 illustrates a cross-sectional view taken along line D-D' of FIG. 1 according to some example embodiments of the present inventive concepts.

FIG. 5 illustrates a cross-sectional view taken along line D-D' of FIG. 1 according to some example embodiments of the present inventive concepts.

Referring to FIG. 5, the second electric conductive bump RBP2 may not be disposed on the second electric conductive pad RPA2. On the second region R2, the dummy conductive pads DPA and the second electric conductive pad RPA2 may have their top surfaces that are exposed to the first holes H1 and are in contact with the under-fill layer 60. According to some example embodiments, the second electric conductive pad RPA2 may be connected to a test circuit TC that may include at least one of the chip internal lines 53 and at least one of the transistors TR. The test circuit TC may be substantially irrelevant to operation of the semiconductor chip 50, and may be present to determine whether the transistors TR and the chip internal lines 53 are normally formed or not. In some example embodiments, the second electric conductive pad RPA2 may be used to inspect the test circuit TC after the fabrication of the semiconductor chip 50. In some embodiments, the test circuit TC may not be used during operation of the semiconductor chip 50. As the second electric conductive pad RPA2 is irrelevant to actual operation of the semiconductor package 100, the second electric conductive pad RPA2 may not be required to have a connection with the second electric conductive bump RBP2. Other configurations may be identical or similar to those discussed above with reference to FIGS. 3 and 4.

Figure 6:
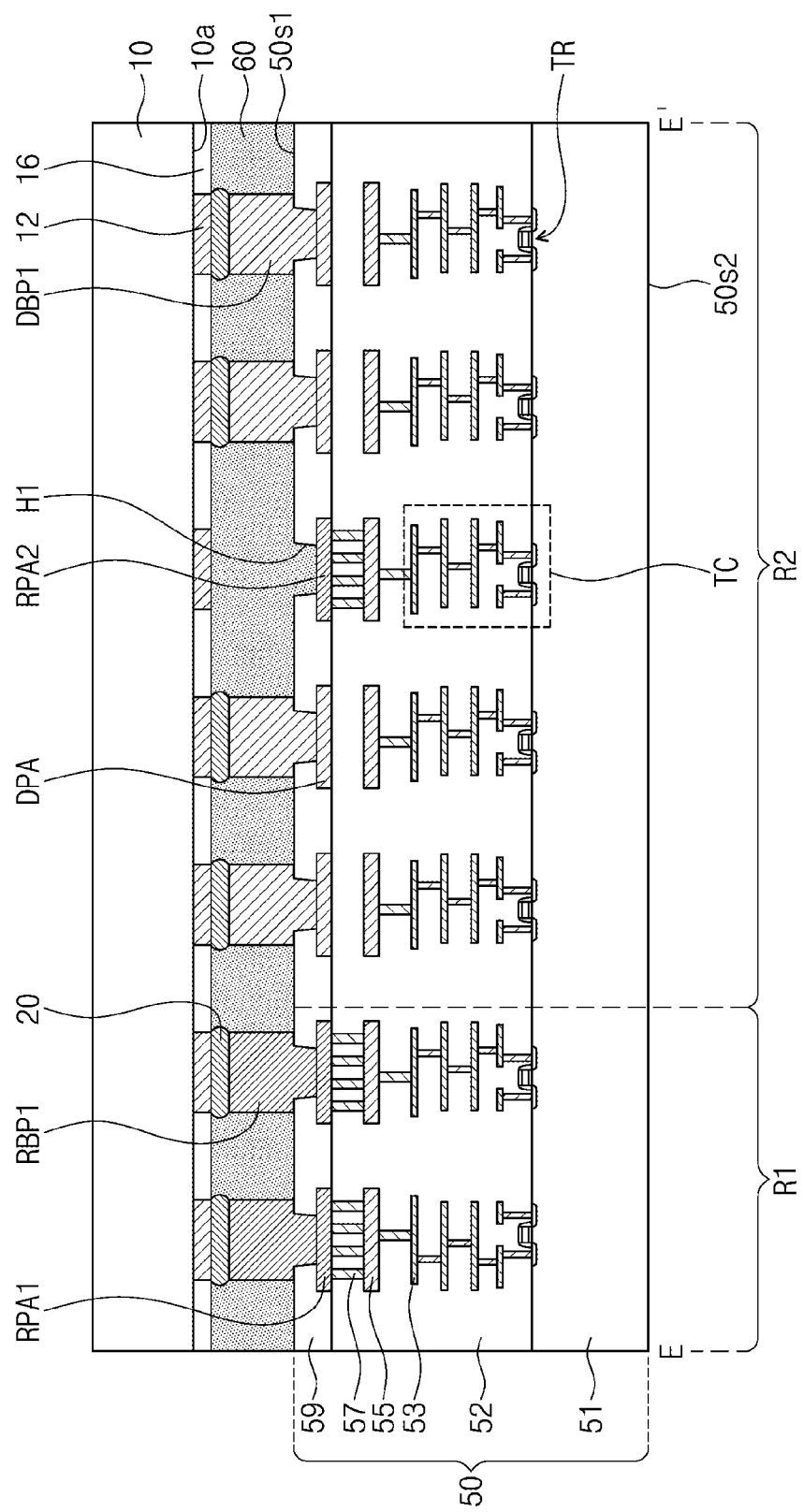
FIG. 6 illustrates a cross-sectional view taken along line E-E' of FIG. 1 according to some example embodiments of the present inventive concepts.

FIG. 6 illustrates a cross-sectional view taken along line E-E' of FIG. 1 according to some example embodiments of the present inventive concepts.

Referring to FIG. 6, the second electric conductive bump RBP2 may not be disposed on the second electric conductive pad RPA2. The first dummy conductive bumps DBP1 may be bonded to all of the dummy conductive pads DPA. In some example embodiments, the second electric conductive pad RPA2 may be connected to the test circuit TC. The under-fill layer 60 may be in contact through the first hole H1 with the second electric conductive pad RPA2. Other configurations may be identical or similar to those discussed with reference to FIGS. 3 to 5.

Figure 7:
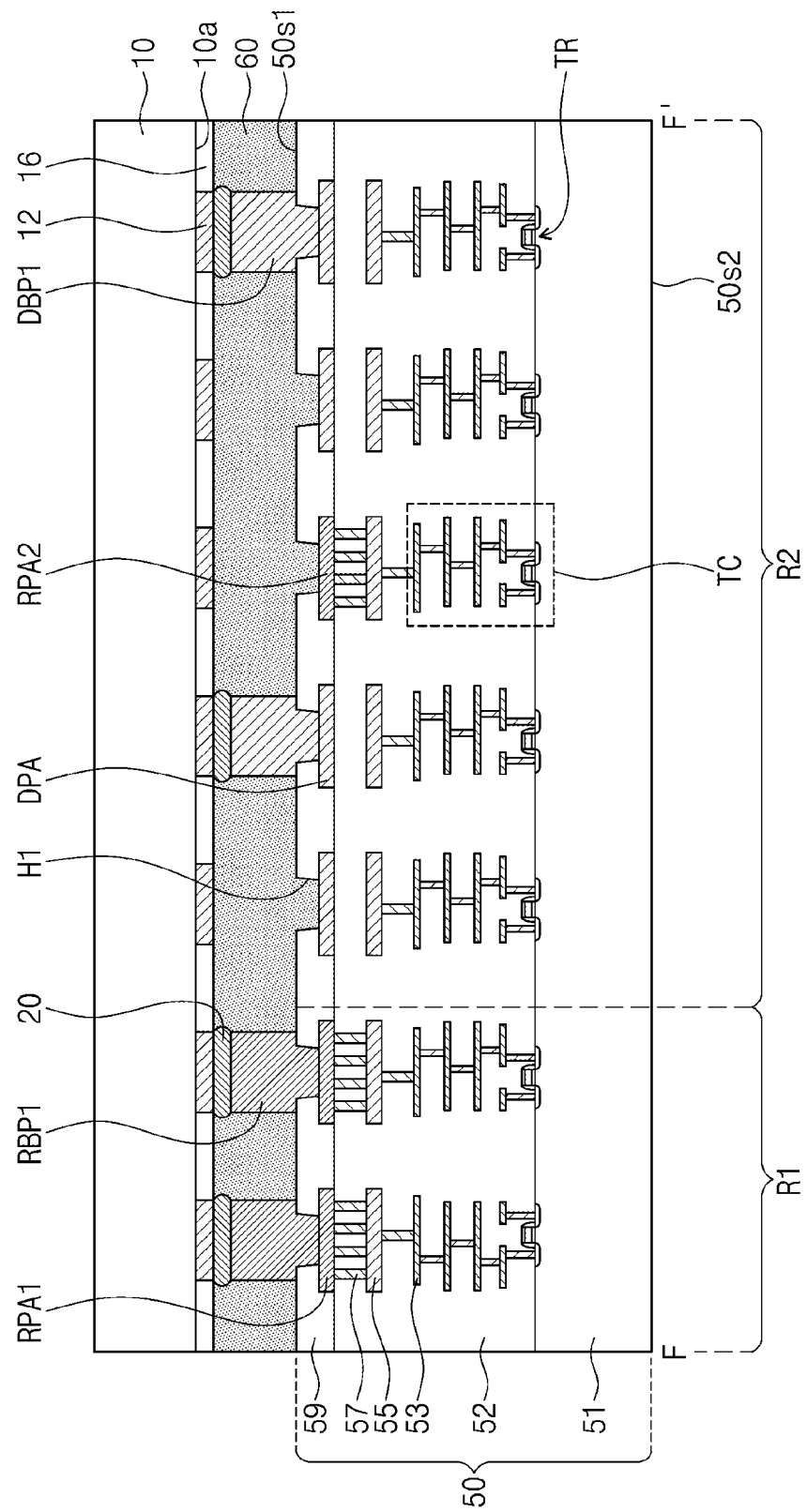
FIG. 7 illustrates a cross-sectional view taken along line F-F' of FIG. 1 according to some example embodiments of the present inventive concepts.

FIG. 7 illustrates a cross-sectional view taken along line F-F' of FIG. 1 according to some example embodiments of the present inventive concepts.

Referring to FIG. 7, the second electric conductive bump RBP2 may not be disposed on the second electric conductive pad RPA2. The first dummy conductive bumps DBP1 may be bonded onto first ones of the dummy conductive pads DPA, and second ones of the dummy conductive pads DPA may be exposed without being bonded with the first dummy conductive bumps DBP1 thereon. Other configurations may be identical or similar to those discussed with reference to FIGS. 3 to 5.

Figure 8:
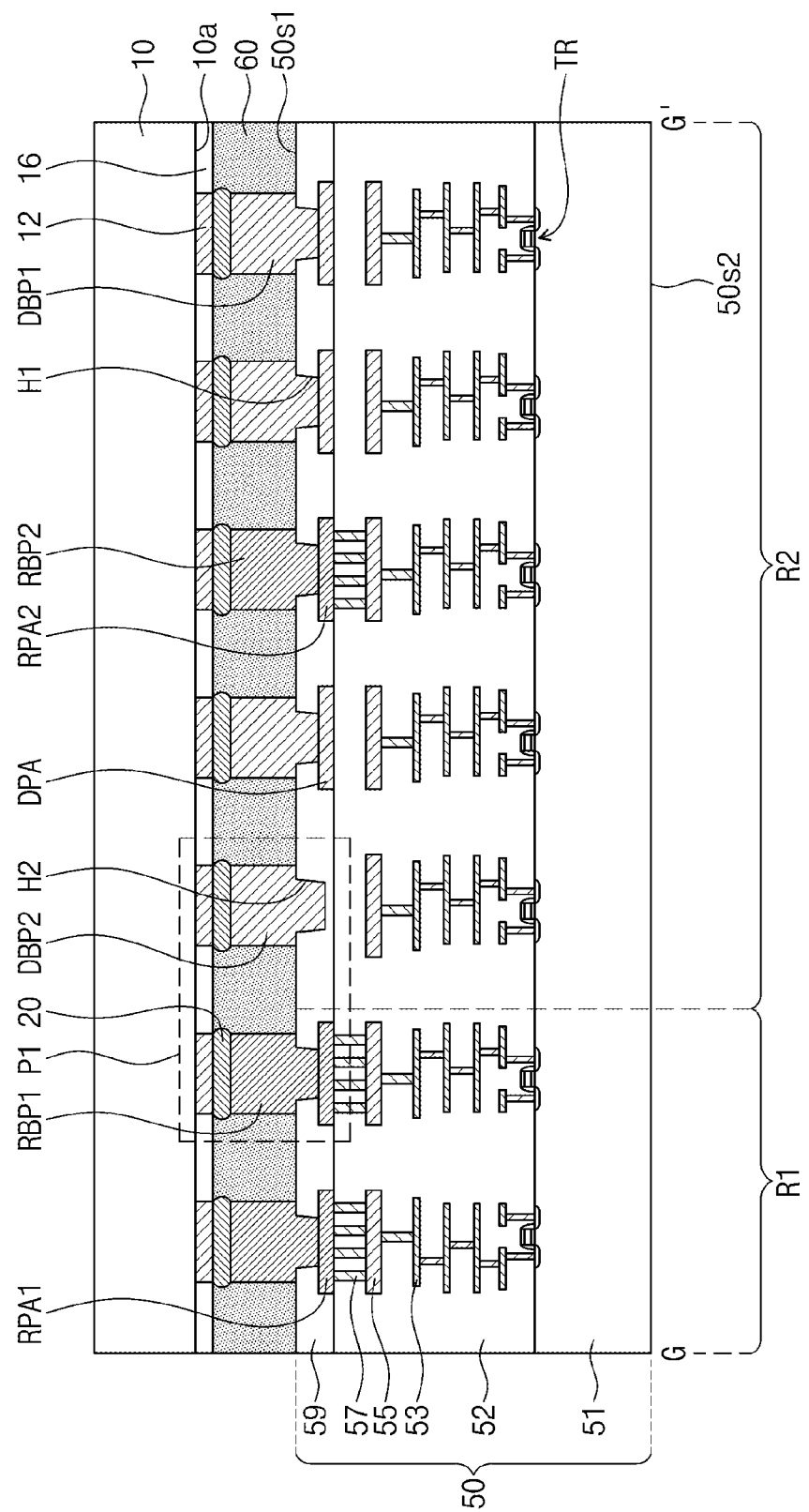
FIG. 8 illustrates a cross-sectional view taken along line G-G' of FIG. 1 according to some example embodiments of the present inventive concepts.
Figure 9:
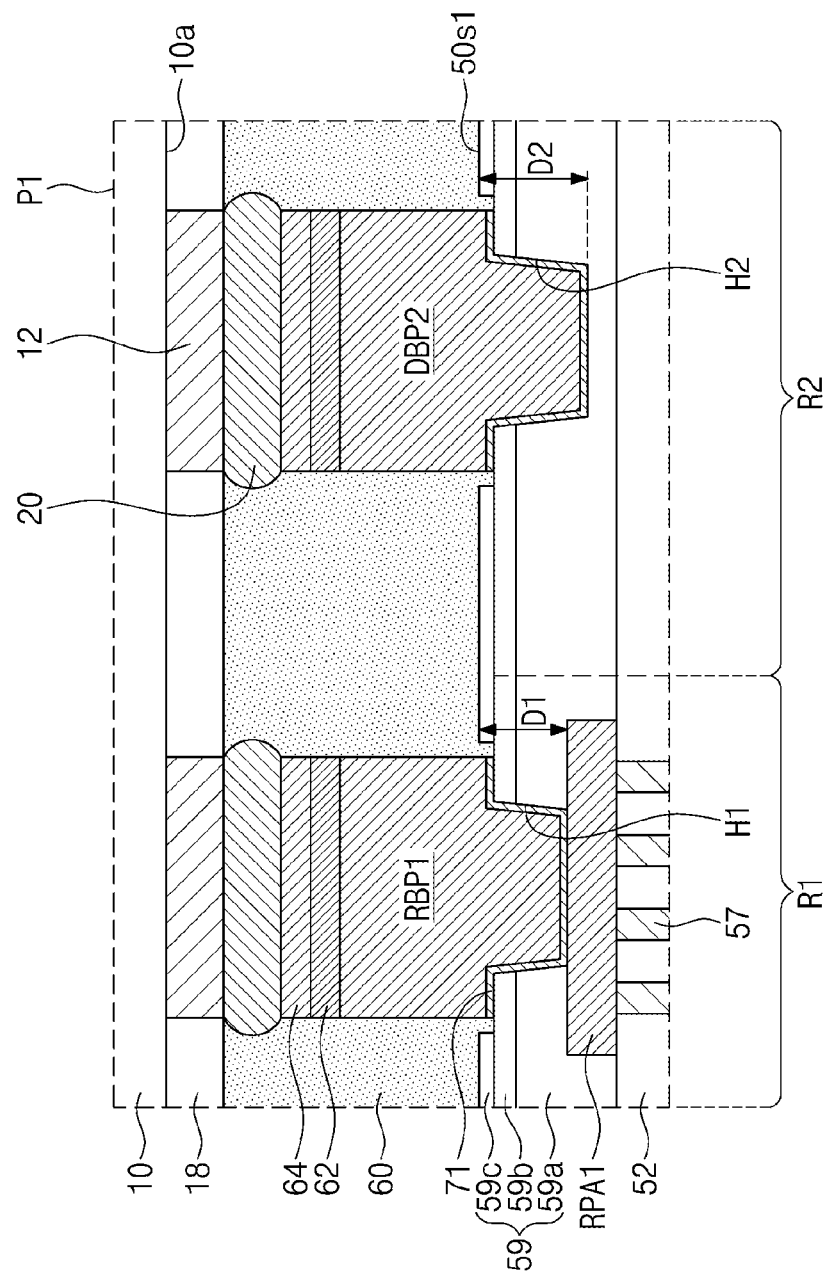
FIG. 9 illustrates an enlarged view showing section P1 of FIG. 8 according to some example embodiments of the present inventive concepts.

FIG. 8 illustrates a cross-sectional view taken along line G-G' of FIG. 1 according to some example embodiments of the present inventive concepts. FIG. 9 illustrates an enlarged view showing section P1 of FIG. 8 according to some example embodiments of the present inventive concepts.

Referring to FIGS. 8 and 9, on the second region R2, the second electric conductive bump RBP2 may be bonded to the second electric conductive pad RPA2, and the first dummy conductive bumps DBP1 may be bonded to all of the dummy conductive pads DPA. In addition, the second dummy conductive bump DBP2 may be bonded to the passivation layer 59. On the second region R2, the passivation layer 59 may include one or more second holes H2 spaced apart from the first holes H1. The second hole H2 may not vertically overlap any of the conductive pads RPA1, RPA2, and DPA. It will be understood that "an element A not vertically overlapping an element B" (or similar language) as used herein means that no vertical line intersecting both the elements A and B exists. The second hole H2 may not expose the interlayer dielectric layer 52. In some embodiments, the second hole H2 may not extend through the passivation layer 59 and may extend partially into the passivation layer 59 in a thickness direction of the passivation layer 59 as illustrated in FIG. 8. Accordingly, a portion of the passivation layer 59 may be between the second dummy conductive bump DBP2 and the interlayer dielectric layer 52. The second hole H2 may be referred to as a recess or a trench. In some embodiments, the second dummy conductive bump DBP2 may be directly bonded without the second hole H2 to an upper portion of the passivation layer 59.

Any of the conductive pads RPA1, RPA2, and DPA may not be present below the second hole H2. The first hole H1 may have a first depth D1 from the first chip surface 50s1 that is a top surface of the passivation layer 59. The second hole H2 may have a second depth D2 from the first chip surface 50s1. The second depth D2 may be greater than the first depth D1. A metal base layer 71 may be interposed between the second dummy conductive bump DBP2 and the passivation layer 59. A diffusion stop layer 62 and an adhesive layer 64 may be interposed between the second dummy conductive bump DBP2 and the solder layer 20. The second dummy conductive bump DBP2 may be disposed in plural. Likewise the first dummy conductive bumps DBP1, the number of the second dummy conductive bumps DBP2 may be adjusted to improve or optimize reliability and performance of the semiconductor package 100.

In some example embodiments, the passivation layer 59 may include a first sub-passivation layer 59a, a second sub-passivation layer 59b, and a third sub-passivation layer 59c that are sequentially stacked and have different dielectric materials from each other. The first sub-passivation layer 59a may be formed of, for example, a silicon oxide layer. The second sub-passivation layer 59b may be formed of, for example, a silicon nitride layer. The third sub-passivation layer 59c may be formed of, for example, photosensitive polyimide (PSPI). The third sub-passivation layer 59c may be spaced apart from the conductive bumps RBP1, RBP2, DBP1, and DBP2. The third sub-passivation layer 59c may have a sidewall that is not aligned with, but is spaced apart from that of each of the first and second sub-passivation layers 59a and 59b. A bottom surface of the second hole H2 may be positioned in the first sub-passivation layer 59a. Other configurations may be identical or similar to those discussed with reference to FIGS. 1 to 5.

In some example embodiments of the present inventive concepts, the third sub-passivation layer 59c may be omitted. The diffusion stop layer 62 and the adhesive layer 64 may be omitted to allow the conductive bumps RBP1, RBP2, DBP1, and DBP2 to directly contact the solder layer 20. In this case, the conductive bumps RBP1, RBP2, DBP1, and DBP2 may include nickel.

Figure 10:
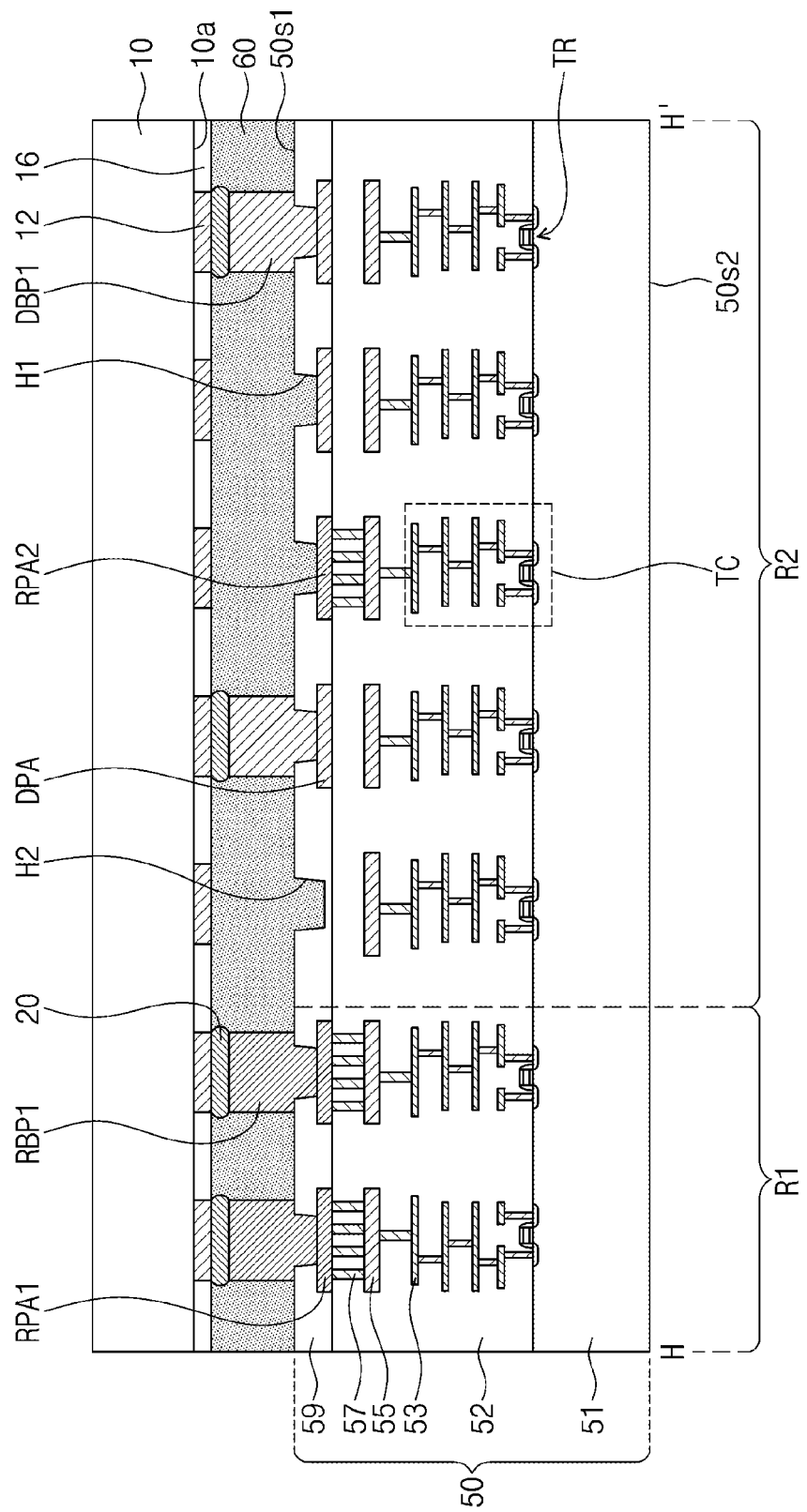
FIG. 10 illustrates a cross-sectional view taken along line H-H' of FIG. 1 according to some example embodiments of the present inventive concepts.

FIG. 10 illustrates a cross-sectional view taken along line H-H' of FIG. 1 according to some example embodiments of the present inventive concepts.

Referring to FIG. 10, the passivation layer 59 may include the second hole H2 as discussed in FIG. 8, but the second dummy conductive bump DBP2 may be excluded or omitted. The under-fill layer 60 may fill the second hole H2. As the second electric conductive bump RBP2 of FIG. 8 is excluded or is omitted, the first hole H1 may expose the second electric conductive pad RPA2. The second electric conductive pad RPA2 may be connected to the test circuit TC. In some example embodiments, one first dummy conductive bump DBP1 may be absent to allow the first hole H1 to expose the dummy conductive pad DPA. The under-fill layer 60 may fill the first holes H1. Other configurations may be identical or similar to those discussed with reference to FIG. 8.

According to some example embodiments of the present inventive concepts, the semiconductor chip 50 may be configured such that the passivation layer 59 includes the first holes H1 that expose all of the conductive pads RPA1, RPA2, and DPA. Therefore, in comparison with a case where only the electric conductive pads RPA1 and RPA2 are exposed, the first holes H1 may have a uniform density per unit area, and thus it may be possible to reduce or avoid process defects caused by a difference in loading effect. In addition, the second hole H2 may be formed even on a location where any of the conductive pads RPA1, RPA2, and DPA is not present, and therefore a density of all holes H1 and H2 may become more uniform. In conclusion, the semiconductor package 100 may have improved reliability.

Furthermore, according to some example embodiments of the present inventive concepts, the semiconductor chip 50 may be configured such that the dummy conductive bumps DBP1 and DBP2 are selectively positioned on predetermined or desired locations, and therefore the semiconductor package 100 may have improved reliability.

According to some example embodiments of the present inventive concepts, the semiconductor package 100 may include all components discussed with reference to FIGS. 3 to 10, or may selectively include one or ones of the components.

Figure 11:
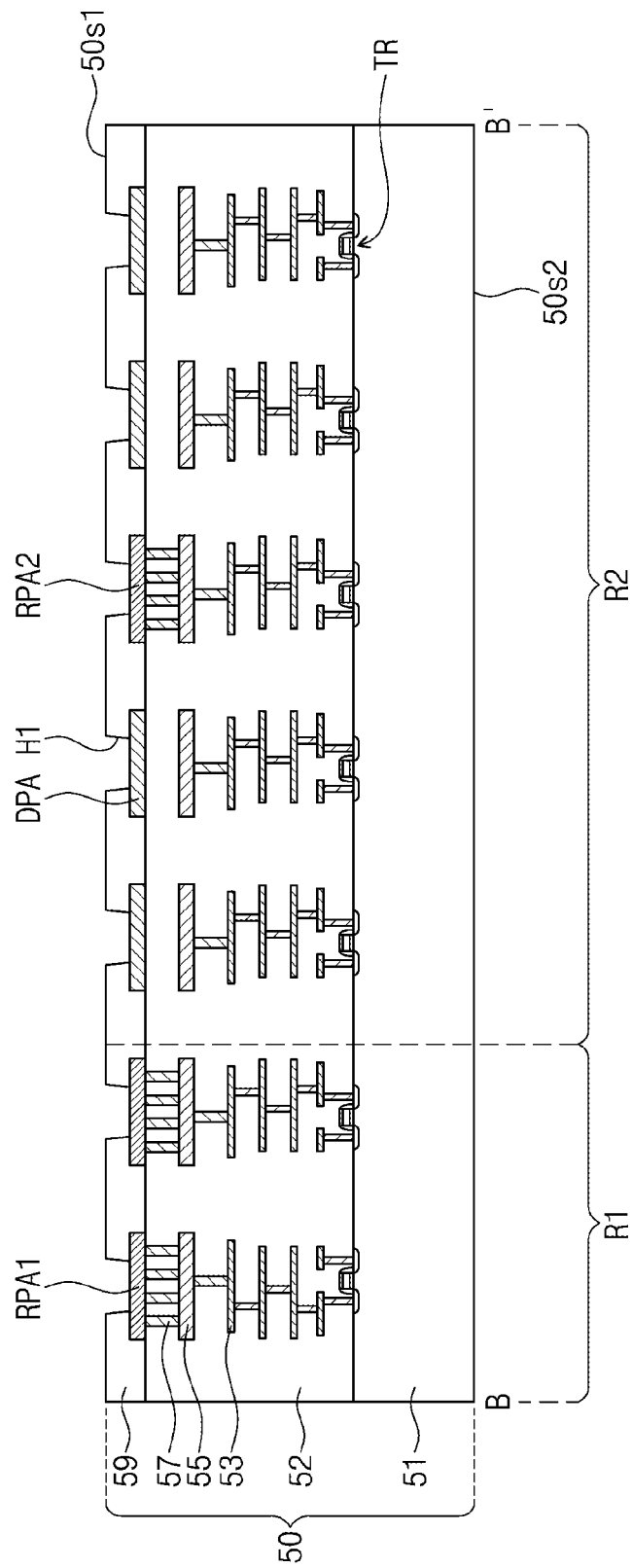
FIG. 11 illustrates a cross-sectional view showing a method of fabricating a semiconductor package according to some example embodiments of the present inventive concepts.

FIG. 11 illustrates a cross-sectional view showing a method of fabricating the semiconductor package depicted in one of FIGS. 3 to 7 according to some example embodiments of the present inventive concepts.

Referring to FIG. 11, the semiconductor substrate 51 (e.g., wafer) including the first region R1 and the second region R2 may undergo processes to form the transistors TR, the chip internal lines 53, the interlayer dielectric layer 52, the top wiring lines 55, the internal vias 57, and the conductive pads RPA1, RPA2, and DPA. The passivation layer 59 may be formed to cover the interlayer dielectric layer 52 and the conductive pads RPA1, RPA2, and DPA. A pad open process may be performed in which the passivation layer 59 is patterned to form the first holes H1 that expose the conductive pads RPA1, RP2, and DPA. At this step, when the passivation layer 59 has a structure such as that of FIG. 9, exposure and development processes may be performed to pattern the third sub-passivation layer 59c formed of photosensitive polyimide (PSPI). Anisotropic etching processes may be performed to etch the first and second sub-passivation layers 59a and 59b. When the third sub-passivation layer 59c is omitted, it may be possible to omit exposure and development processes for patterning of the third sub-passivation layer 59c. For example, the pad open process may selectively include exposure and development processes to pattern the third sub-passivation layer 59c, and may essentially include anisotropic etching processes to etch the first and second sub-passivation layers 59a and 59b. In the pad open process, the first holes H1 may be required to be formed uniformly distributed to prevent process defects caused by loading effects. In some embodiments, the first holes H1 may be spaced apart from each other by a uniform distance as illustrated in FIG. 11.

In the anisotropic etching process, when only the electric conductive pads RPA1 and RPA2 are opened to the first holes H1, and when the dummy conductive pads DPA are covered with the passivation layer 59, the first holes H1 may have different densities between the first region R1 and the second region R2, which may result in the occurrence of process defects caused by loading effects. In this case, a difference in etchant density may occur in the anisotropic etching process, and relatively large amounts of etchants may be present on the second electric conductive pads RPA2 rather than on the first electric conductive pads RPA1, with the result that an oxide layer (e.g., aluminum oxide layer) may be excessively formed on a top surface of the second electric conductive pad RPA2. Therefore, when the electric conductive bumps RBP1 and RBP2 are subsequently bonded to the electric conductive pads RPA1 and RPA2, bonding failure or contact failure may occur on the second electric conductive pad RPA2. In contrast, according to the present inventive concepts, the first holes H1 may expose all of the conductive pads RPA1, RPA2, and DPA, and may be uniformly distributed. Accordingly, process defects may be reduced or prevented.

Moreover, as shown in FIG. 9, in the pad open process, at least one second holes H2 may be formed even on a location where any of the conductive pads RPA1, RPA2, and DPA is not present, and therefore all holes H1 and H2 may be uniformly distributed. In some embodiments, the holes that include both the first holes H1 and the second hole H2 may be spaced apart from each other by a uniform distance as illustrated in FIG. 8. The second hole H2 may be formed simultaneously or concurrently with the first holes H1. However, because any of the conductive pads RPA1, RPA2, and DPA is not present on the location where the second hole H2 is formed, the passivation layer 59 may undergo over-etching to produce a difference in depth between the first and second holes H1 and H2, as shown in FIG. 9. In some embodiments, the holes, including the first holes H1 and the second hole H2 may be formed in a same fabrication step, at approximately (but not necessarily exactly) the same time.

After the pad open process is performed as shown in FIG. 11, the second electric conductive pad RPA2 may be used to perform a test process on the test circuit TC. The metal base layer 71 may be conformally formed on an entire surface of the passivation layer 59, and a photoresist pattern (not shown) may be formed to limit locations where the conductive bumps RBP1, RBP2, DBP1, and DBP2 will be formed. For example, a plating process may be performed to form the conductive bumps RBP1, RBP2, DBP1, and DBP2. At this step, the number and position of the dummy conductive bumps DBP1 and DBP2 may be adjusted to optimize characteristics of the semiconductor package 100. The solder layer 20 may be formed on each of the conductive bumps RBP1, RBP2, DBP1, and DBP2. A singulation process may be performed to cut the wafer 51 into a plurality of chips, and thus the semiconductor chip 50 may be formed. Referring back to FIG. 2, a non-conductive film (NCF) may be used to mount the semiconductor chip 50 on the package substrate 10, and then the non-conductive film may be heated to form the under-fill layer 60. The mold layer 70 may be formed to cover the semiconductor chip 50 and the package substrate 10.

Figure 12:
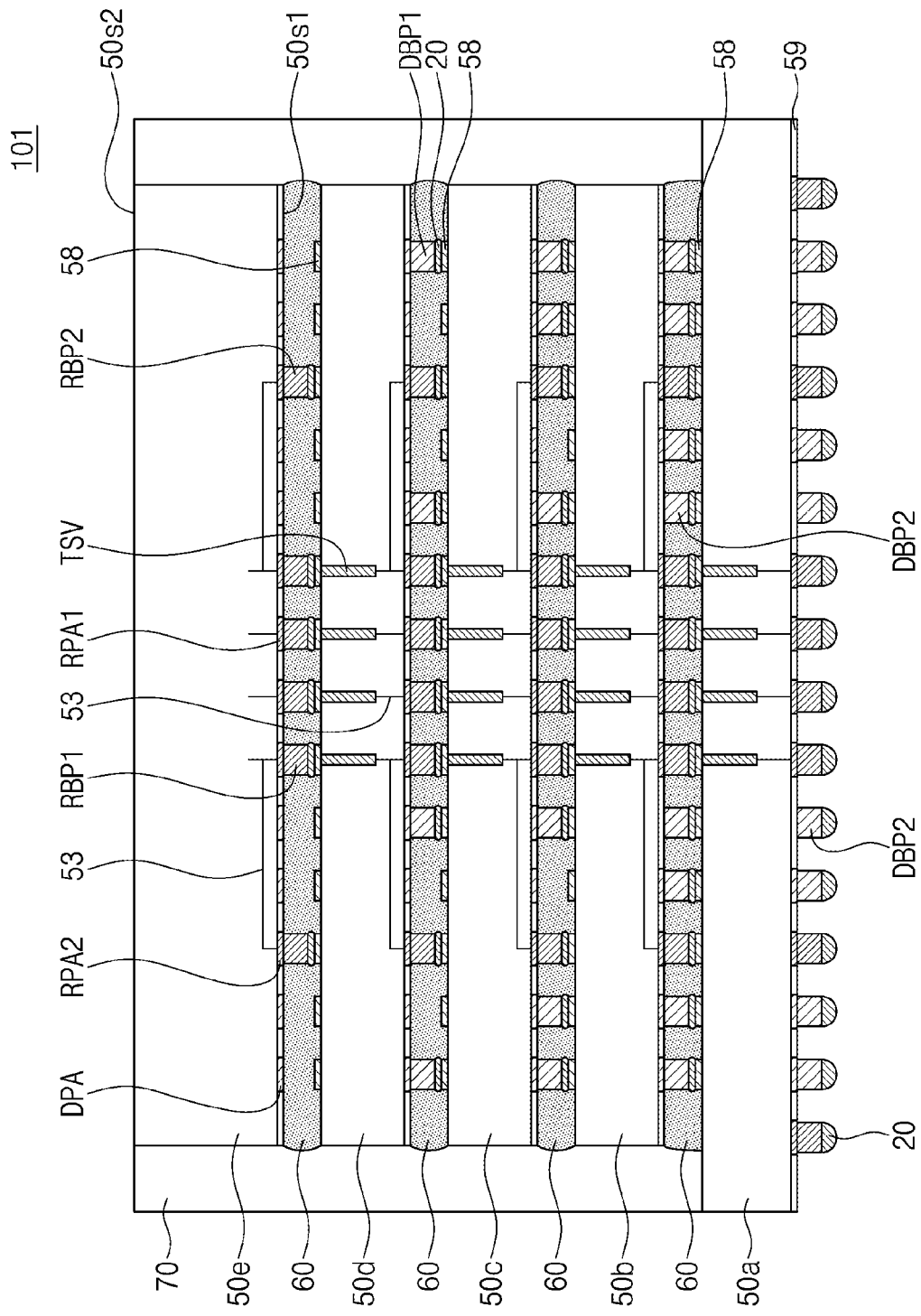
FIG. 12 illustrates a cross-sectional view showing a semiconductor package according to some example embodiments of the present inventive concepts.

FIG. 12 illustrates a cross-sectional view showing a semiconductor package according to some example embodiments of the present inventive concepts.

Referring to FIG. 12, a semiconductor package 101 may include first to fifth semiconductor chips 50a to 50e that are sequentially stacked. Each of the first to fifth semiconductor chips 50a to 50e may have a first chip surface 50s1 and a second chip surface 50s2 that are opposite to each other. In some embodiments, the first semiconductor chip 50a may have a width greater than those of the second to fifth semiconductor chips 50b to 50e as illustrated in FIG. 12. In some embodiments, the first semiconductor chip 50a may have a width greater than those of the second to fourth semiconductor chips 50b to 50d. In some embodiments, the fifth semiconductor chip 50e may have a width greater than those of the first to fourth semiconductor chips 50a to 50d. In some embodiments, the fifth semiconductor chip 50e may have a width greater than those of the second to fourth semiconductor chips 50b to 50d. The first semiconductor chip 50a may be of a different type from those of the second to fourth semiconductor chips 50b to 50e. The second to fifth semiconductor chips 50b to 50e may be of the same type. For example, the first semiconductor chip 50a may be a logic chip, and the second to fifth semiconductor chips 50b to 50e may be the same memory chip, for example, a DRAM chip.

In some example embodiments, five semiconductor chips are stacked, but the number and/or position of the stacked semiconductor chips may be variously changed. The fifth semiconductor chip 50e may have a thickness greater than those of the second to fourth semiconductor chips 50b to 50d.

An under-fill layer 60 may be interposed between the first to fifth semiconductor chips 50a to 50e. A mold layer 70 may cover lateral surfaces of the second to fifth semiconductor chips 50b to 50e and a top surface of the first semiconductor chip 50a. The fifth semiconductor chip 50e may have a top surface that is exposed without being covered with the mold layer 70. The top surface of the fifth semiconductor chip 50e may be coplanar with that of the mold layer 70. The semiconductor package 101 may be a high bandwidth memory (HBM) chip.

Each of the first to fifth semiconductor chips 50a to 50e may have one of the structures discussed with reference to FIGS. 3 to 10. For example, as discussed with reference to FIGS. 3 to 10, each of the first to fifth semiconductor chips 50a to 50e may include the conductive pads RPA1, RPA2, and DPA disposed adjacent to the first chip surface 50s1. In addition, each of the first to fourth semiconductor chips 50a to 50d may further include upper conductive pads 58 disposed on the second chip surface 50s2. Each of the first to fifth semiconductor chips 50a to 50e may include the semiconductor substrate 51, the transistors TR, the interlayer dielectric layer 52, the chip internal lines 53, and the top wiring lines 55 that are discussed with reference to FIG. 3. For brevity of illustration, the semiconductor substrate 51, the transistors TR, the interlayer dielectric layer 52, and the top wiring lines 55 of FIG. 3 are not shown in the first to fifth semiconductor chips 50a to 50e. Each of the first to fourth semiconductor chips 50a to 50d may further include through vias TSV that partially penetrate therethrough. The through vias TSV may penetrate at least portions of the semiconductor substrate 51 and the interlayer dielectric layer 52 of FIG. 3, thereby having electrical connections with the chip internal lines 53. The through vias TSV may be connected to corresponding upper conductive pads 58.

Each of the first to fifth semiconductor chips 50a to 50e may include the passivation layer 59 including the first holes H1 and the second holes H2, as discussed with reference to FIGS. 3 to 10. The passivation layer 59 included in the first semiconductor chip 50a may have, for example, a structure (e.g., including the first, second, and third sub-passivation layers 59a, 59b, and 59c) of the passivation layer 59 shown in FIG. 9. The passivation layer 59 included in each of the second to fifth semiconductor chips 50b to 50e may have, for example, a structure where the third sub-passivation layer 59c is omitted from the passivation layer 59 shown in FIG. 9.

The conductive bumps RBP1, RBP2, and DBP1 may be bonded to the conductive pads RPA1, RPA2, and DPA in each of the first to fifth semiconductor chips 50a to 50e. In addition, the second dummy conductive bump DBP2 may be bonded to the passivation layer 59. The solder layer 20 may be bonded to each of the conductive bumps RBP1, RBP2, DBP1, and DBP2.

The number and position of the dummy conductive bumps DBP1 and DBP2 may be adjusted to improve or optimize reliability and performance of the semiconductor package 101. For example, the second to fifth semiconductor chips 50b to 50e may have the same number of the electric conductive bumps RBP1 and RBP2 bonded to the first chip surface 50s1, but may have different numbers of the dummy conductive bumps DBP1 and DBP2. In some example embodiments, the number of the dummy conductive bumps DBP1 and DBP2 may increase as approaching the first semiconductor chip 50a. For example, when viewed in a cross-section of the semiconductor package 101 of FIG. 12, the number of the dummy conductive bumps DBP1 and DBP2 bonded to the first chip surface 50s1 may be respectively eight, sixth, four, and zero in the second, third, fourth, and fifth semiconductor chips 50b, 50c, 50d, and 50e. Therefore, it may be possible to reduce loads applied to the first semiconductor chip 50a and to improve a warpage phenomenon of the semiconductor package 101.

The number and position of the dummy conductive bumps DBP1 and DBP2 in the semiconductor package 101 may be variously changed to improve and optimize performance of the semiconductor package 101. For example, the number of the dummy conductive bumps DBP1 and DBP2 may decrease as approaching the first semiconductor chip 50a. In some embodiments, the number of the dummy conductive bumps DBP1 and DBP2 disposed on even-numbered semiconductor chips may be different from the number of the dummy conductive bumps DBP1 and DBP2 disposed on odd-numbered semiconductor chips.

In FIG. 12, a package substrate may substitute the first semiconductor chip 50a located at lowermost position. In this description, the term "a semiconductor chip" may refer to "a semiconductor die".

Figure 13:
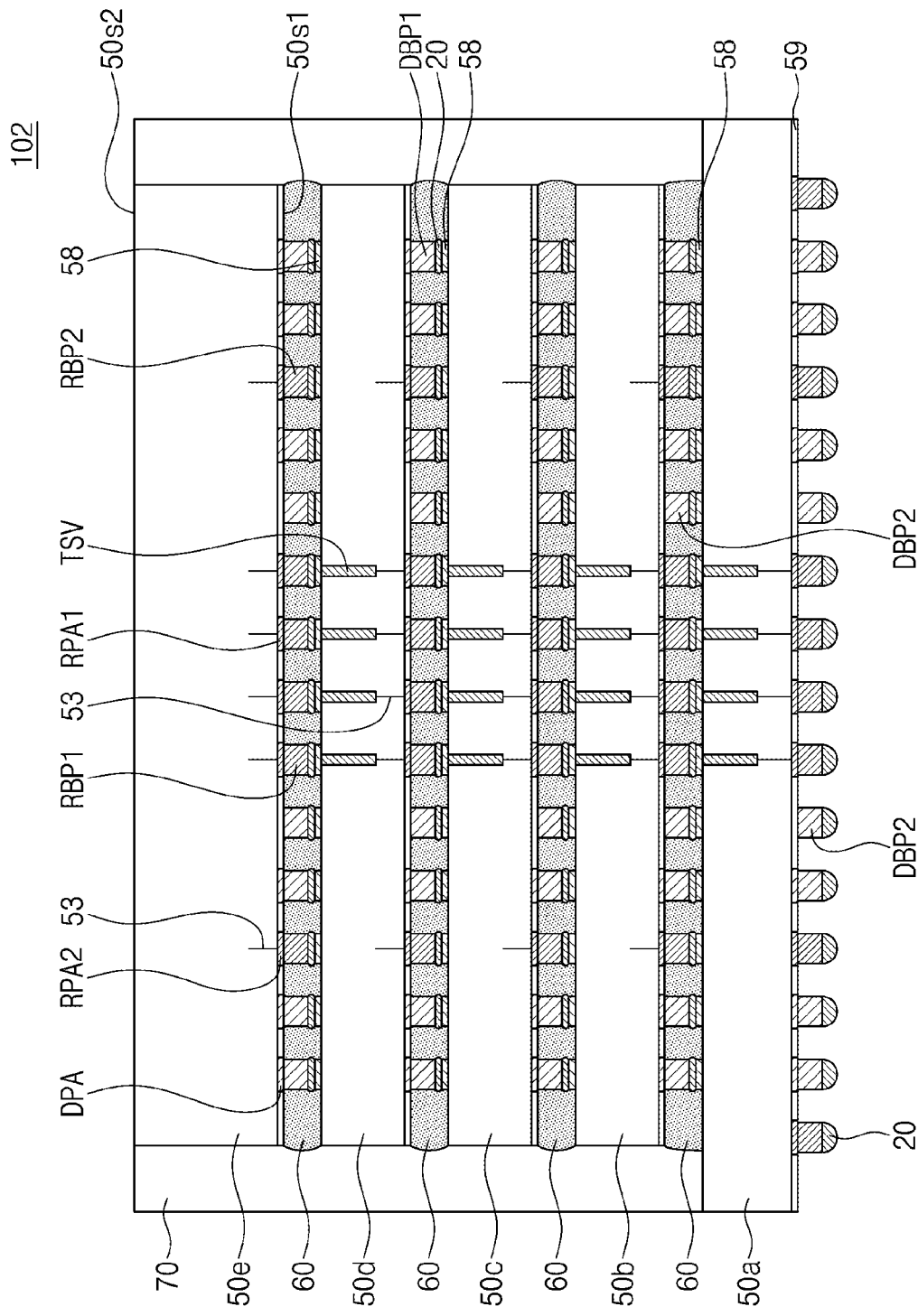
FIG. 13 illustrates a cross-sectional view showing a semiconductor package according to some example embodiments of the present inventive concepts.

FIG. 13 illustrates a cross-sectional view showing a semiconductor package according to some example embodiments of the present inventive concepts.

Referring to FIG. 13, a semiconductor package 102 may be configured analogously to the semiconductor package 101 depicted in FIG. 12. For example, the second to fifth semiconductor chips 50b to 50e may have the same number of the electric conductive bumps RBP1 and RBP2 bonded to the first chip surface 50s1, and may also have the same number of the dummy conductive bumps DBP1 and DBP2. Other configurations may be identical or similar to those discussed above with reference to FIG. 12.

A semiconductor chip included in a semiconductor package according to the present inventive concepts may be configured such that a passivation layer includes first holes that expose all of conductive pads, and thus it may be possible to reduce or prevent process defects caused by loading effects in a pad open process.

Moreover, the semiconductor package according to the present inventive concepts may include one or more second holes formed on locations where the conductive pads are absent, and thus it may be possible to reduce or prevent process defects caused by loading effects in a pad open process.

Further, in the semiconductor package according to the present inventive concepts, the number and position of dummy conductive bumps may be adjusted to improve or optimize performance of the semiconductor package and to improve or increase reliability of the semiconductor package.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope of the present inventive concepts. For example, components of FIGS. 1 to 13 may be combined with each other. The above-disclosed subject matter is to be considered illustrative, and not restrictive, and the appended claims are intended to cover all such modifications, enhancements, and other embodiments, which fall within the scope of the inventive concepts.

What is claimed is:

1. A semiconductor package, comprising:
a semiconductor chip on a package substrate; and
an under-fill layer between the semiconductor chip and the package substrate,
wherein the semiconductor chip includes:
a semiconductor substrate;
an interlayer dielectric layer on the semiconductor substrate and including a plurality of connection lines;
a plurality of conductive pads on the interlayer dielectric layer, first ones of the plurality of conductive pads being electrically connected to first ones of the plurality of connection lines, respectively, and second ones of the plurality of conductive pads being electrically isolated from the plurality of connection lines;
a passivation layer on the interlayer dielectric layer and including a plurality of first holes, the plurality of first holes on the first ones of the plurality of conductive pads and the second ones of the plurality of conductive pads, respectively; and
a plurality of first conductive bumps bonded to the first ones of the plurality of conductive pads, respectively,
wherein the under-fill layer includes a first portion, and the first portion is in a first one of the plurality of first holes and is in contact with a first conductive pad of the second ones of the plurality of conductive pads.

2. The semiconductor package of claim 1, further comprising a second conductive bump bonded to a second conductive pad of the second ones of the plurality of conductive pads.

3. The semiconductor package of claim 1, wherein the plurality of conductive pads further includes a third conductive pad that is electrically connected to a second one of the plurality of connection lines, and
wherein the under-fill layer includes a second portion, and the second portion is in a second one of the plurality of first holes and is in contact with the third conductive pad.

4. The semiconductor package of claim 3, wherein the semiconductor chip further includes a test circuit, and the test circuit is connected to the third conductive pad and is in the interlayer dielectric layer.

5. The semiconductor package of claim 1, wherein the plurality of conductive pads further includes a third conductive pad that is electrically connected to a second one of the plurality of connection lines, and
wherein the semiconductor package further includes a third conductive bump that extends through the passivation layer and is bonded to the third conductive pad.

6. The semiconductor package of claim 1, wherein the passivation layer further includes a second hole spaced apart from the plurality of first holes,
wherein the second hole extends partially into the passivation layer in a thickness direction of the passivation layer.

7. The semiconductor package of claim 6, wherein a depth of the second hole is greater than each of respective depths of the plurality of first holes.

8. A semiconductor package, comprising:
a semiconductor chip on a package substrate,
wherein the semiconductor chip includes:
a semiconductor substrate;
an interlayer dielectric layer on the semiconductor substrate and including a plurality of connection lines;
a plurality of conductive pads on the interlayer dielectric layer, first ones of the plurality of conductive pads being electrically connected to first ones of the plurality of connection lines, and second ones of the plurality of conductive pads being electrically isolated from the plurality of connection lines; and
a passivation layer on the interlayer dielectric layer,
wherein the passivation layer includes a plurality of first holes and a second hole,
wherein ones of the plurality of first holes are on the first ones of the plurality of conductive pads and the second ones of the plurality of conductive pads, respectively, and
wherein the second hole does not vertically overlap any of the first ones of the plurality of conductive pads and does not vertically overlap any of the second ones of the plurality of conductive pads.

9. The semiconductor package of claim 8, wherein the second hole does not extend through the passivation layer.

10. The semiconductor package of claim 8, wherein each of the plurality of first holes has a first depth, the second hole has a second depth, and
the second depth is greater than the first depth.

11. The semiconductor package of claim 8, wherein the semiconductor chip further includes a second conductive bump bonded to one of the second ones of the plurality of conductive pads.

12. The semiconductor package of claim 8, wherein the plurality of conductive pads further includes a third conductive pad that is electrically connected to a second one of the plurality of connection lines, and
wherein the semiconductor package further includes a third conductive bump that extends through the passivation layer and is bonded to the third conductive pad.

13. The semiconductor package of claim 8, further comprising an under-fill layer between the package substrate and the semiconductor chip,
wherein the plurality of conductive pads further includes a third conductive pad that is electrically connected to a second one of the plurality of connection lines, wherein one of the plurality of first holes of the passivation layer is on the third conductive pad, and wherein the under-fill layer includes a portion that is in the one of the plurality of first holes and that is in contact with the third conductive pad.

14. The semiconductor package of claim 13, wherein the semiconductor chip further includes a test circuit, and the test circuit is connected to the third conductive pad and is disposed in the interlayer dielectric layer.

15. A semiconductor package, comprising:
a first semiconductor chip, a second semiconductor chip, and a third semiconductor chip that are sequentially stacked;
a plurality of first electric conductive bumps and a plurality of first dummy conductive bumps between the first semiconductor chip and the second semiconductor chip; and
a plurality of second electric conductive bumps and a plurality of second dummy conductive bumps between the second semiconductor chip and the third semiconductor chip,
wherein the plurality of first electric conductive bumps and the plurality of second electric conductive bumps are configured to transmit electrical signals between the first, second, and third semiconductor chips,
wherein the plurality of first dummy conductive bumps and the plurality of second dummy conductive bumps are electrically floated,
wherein the plurality of first electric conductive bumps and the plurality of second electric conductive bumps include an equal number of electric conductive bumps, and
wherein the plurality of first dummy conductive bumps and the plurality of second dummy conductive bumps include different numbers of dummy conductive bumps.

16. The semiconductor package of claim 15, wherein a width of the first semiconductor chip is greater than a width of each of the second and third semiconductor chips.

17. The semiconductor package of claim 15, wherein the first semiconductor chip is a logic chip, and the second semiconductor chip and the third semiconductor chip are memory chips.

18. The semiconductor package of claim 15, further comprising an under-fill layer between the first semiconductor chip and the second semiconductor chip,
wherein the second semiconductor chip includes:
a semiconductor substrate;
an interlayer dielectric layer on the semiconductor substrate and including a plurality of connection lines;
a plurality of conductive pads on the interlayer dielectric layer, first ones of the plurality of conductive pads being electrically connected to ones of the plurality of connection lines, respectively, and second ones of the plurality of conductive pads being electrically isolated from the plurality of connection lines;
a passivation layer on the interlayer dielectric layer and including a plurality of first holes that are on the first ones of the plurality of conductive pads and the second ones of the plurality of conductive pads, respectively; and
a plurality of first conductive bumps bonded to the first ones of the plurality of conductive pads, respectively,
wherein the under-fill layer includes a portion, and the portion is in one of the plurality of first holes and is in contact with a first conductive pad of the second ones of the plurality of conductive pads.

19. The semiconductor package of claim 18, wherein ones of the first dummy conductive bumps are bonded to second conductive pads of the second ones of the plurality of conductive pads, respectively.

20. The semiconductor package of claim 18, wherein at least one of the plurality of first dummy conductive bumps is bonded to the passivation layer.

* * * * *